United States Patent [19]

Terashima

[11] Patent Number: 5,472,099
[45] Date of Patent: Dec. 5, 1995

[54] WAFER CASSETTE

[75] Inventor: Seiichi Terashima, Gunma, Japan

[73] Assignee: Shin-Etsu Handotai Co., Ltd., Tokyo, Japan

[21] Appl. No.: 186,848

[22] Filed: Jan. 27, 1994

[30] Foreign Application Priority Data

Jan. 29, 1993 [JP] Japan .................. 5-006660 U

[51] Int. Cl.⁶ .................................................. B65B 21/02
[52] U.S. Cl. ........................... 211/41; 206/454; 118/500
[58] Field of Search ............................... 211/41; 206/454; 118/500

[56] References Cited

U.S. PATENT DOCUMENTS

| | | | |
|---|---|---|---|
| 2,813,633 | 11/1957 | Welling | 211/41 |
| 4,176,751 | 12/1979 | Gillissie | 211/41 |
| 5,044,752 | 9/1991 | Thurfjell et al. | 356/400 |
| 5,193,682 | 3/1993 | Naito et al. | 211/41 X |
| 5,219,079 | 6/1993 | Nakamura | 211/41 |

FOREIGN PATENT DOCUMENTS 0477897   1/1992   European Pat. Off. .
2624839   6/1989   France .

Primary Examiner—Robert W. Gibson, Jr.
Attorney, Agent, or Firm—Ronald R. Snider

[57] ABSTRACT

A wafer cassette is provided which has a multiplicity of shelves provided in one side thereof with a notch and placed at intervals to give rise to open spaces therebetween for insertion of a wafer, provides the open spaces in the recesses thereof with buffer members severally adapted to meet in collision with part of the outer periphery of a wafer, and allows the notches in the multiplicity of shelves jointly to form an empty space for extractably admitting the leading end part of a wafer conveyor. The wafer cassette of this invention permits wafers carried on the wafer conveyor to be sent out past the leading end part of the conveyor and inserted automatically into the empty spaces formed in the cassette for insertion of wafers and stowed in the cassette after collision against the buffer members when the leading end part of the wafer conveyor (the end part on the wafer discharging side) is inserted into the empty space mentioned above and then set operating. Thus, the accommodation of individual wafers and the conveyance of a cassette as an integral unit are simultaneously materialized and the wafer processing system can be automated up to the very end thereof.

7 Claims, 3 Drawing Sheets

1

WAFER CASSETTE

BACKGROUND OF THE INVENTION

1. Field of the Invention

This invention relates to a wafer cassette which is capable of extractably accommodating a multiplicity of silicon wafers (hereinafter referred to as "wafers").

2. Description of the Prior Art

Heretofore, the wafers which are obtained by slicing an ingot with a proper device are stowed by an operator in special cases having a fixed capacity for 20 to 30 pieces and delivered to sites for aftertreatment, test, analysis, etc.

The operation of handling the wafers in the manner described above, however, entails the disadvantage that the wafers in the process of being stowed in the special cases tend to attract dust, the operator is burdened with much labor, and the important work of moving and loading the special cases must be performed manually.

SUMMARY OF THE INVENTION

This invention aims to solve the problem mentioned above. Thus, it is a primary object of this invention to provide a wafer cassette which is capable of accommodating wafers by an automatic operation and, therefore, taking the place of the conventional inefficient special cases. Another object of this invention is to provide a wafer cassette such that the cassette filled with wafers can be moved and loaded exclusively by a mechanical operation.

The wafer cassette representing the first aspect of this invention is characterized by having a multiplicity of shelves provided in one side thereof with a notch and placed at intervals to give rise to open spaces therebetween for insertion of a wafer, providing the open spaces in the recesses thereof with buffer members severally adapted to meet in collision with part of the outer periphery of a wafer, and allowing the notches in the multiplicity of shelves jointly to form an empty space for extractably admitting the leading end part of a wafer conveyor.

The wafer cassette representing the second aspect of this invention is characterized by having the multiplicity of shelves supported and fixed in place with a plurality of struts through the medium of spacers and having supporting plates shaped identically with the shelves, provided with engaging holes for fixing the cassette at a prescribed position, and attached one each to the opposite terminal parts of the plurality of struts parallelly to the shelves.

The wafer cassette representing the third aspect of this invention is characterized by having two platelike buffer members disposed near the farthest recesses of the notches in the multiplicity of shelves perpendicularly to the shelves as symmetrically opposed to each other so as to include therebetween an angle in the range of 130 to 140 degrees and providing the shelves and supporting plates at the center of symmetry in the space intervening between the buffer plates with a through inspection hole for allowing discernment of the presence or absence of a wafer in the open space between the shelves.

In the wafer cassette embodying the first aspect of this invention, wafers being carried on a wafer conveyor are sent past the leading end part of the wafer conveyor (the end part on the wafer discharging side) and automatically inserted into the open spaces formed in the wafer cassette for extractably accommodating wafers and set in place inside the cassette after collision with the buffer members when the leading end part of the wafer conveyor is inserted into the empty space mentioned above and the conveyor is set operating.

In the wafer cassette embodying the second aspect of this invention, an empty wafer cassette is fixed at the prescribed position through the medium of the engaging holes and caused thereat to accommodate wafers as described above. The cassette now filled with wafers is fixed at a prescribed position similarly through the medium of the engaging holes.

In the wafer cassette embodying the third aspect of this invention, the wafers are stowed in the cassette after colliding against both the platelike buffer which are members disposed so as to include therebetween an angle in the range of 130 to 140 degrees. Owing to this arrangement, even wafers differing in size are stowed in the cassette so orderly that the centers thereof fall substantially on one straight line.

An optical sensor which is adapted to emit light through the inspection holes into the interior of the cassette permits discernment of the presence or absence of wafers in the cassette.

BRIEF DESCRIPTION OF THE DRAWINGS

The invention will be better understood and the objects and features thereof other than those set forth above will become apparent when consideration is given to the following detailed description thereof, which makes reference to the annexed drawings wherein.

DETAILED DESCRIPTION OF THE PREFERRED EMBODIMENT

Figure 1:
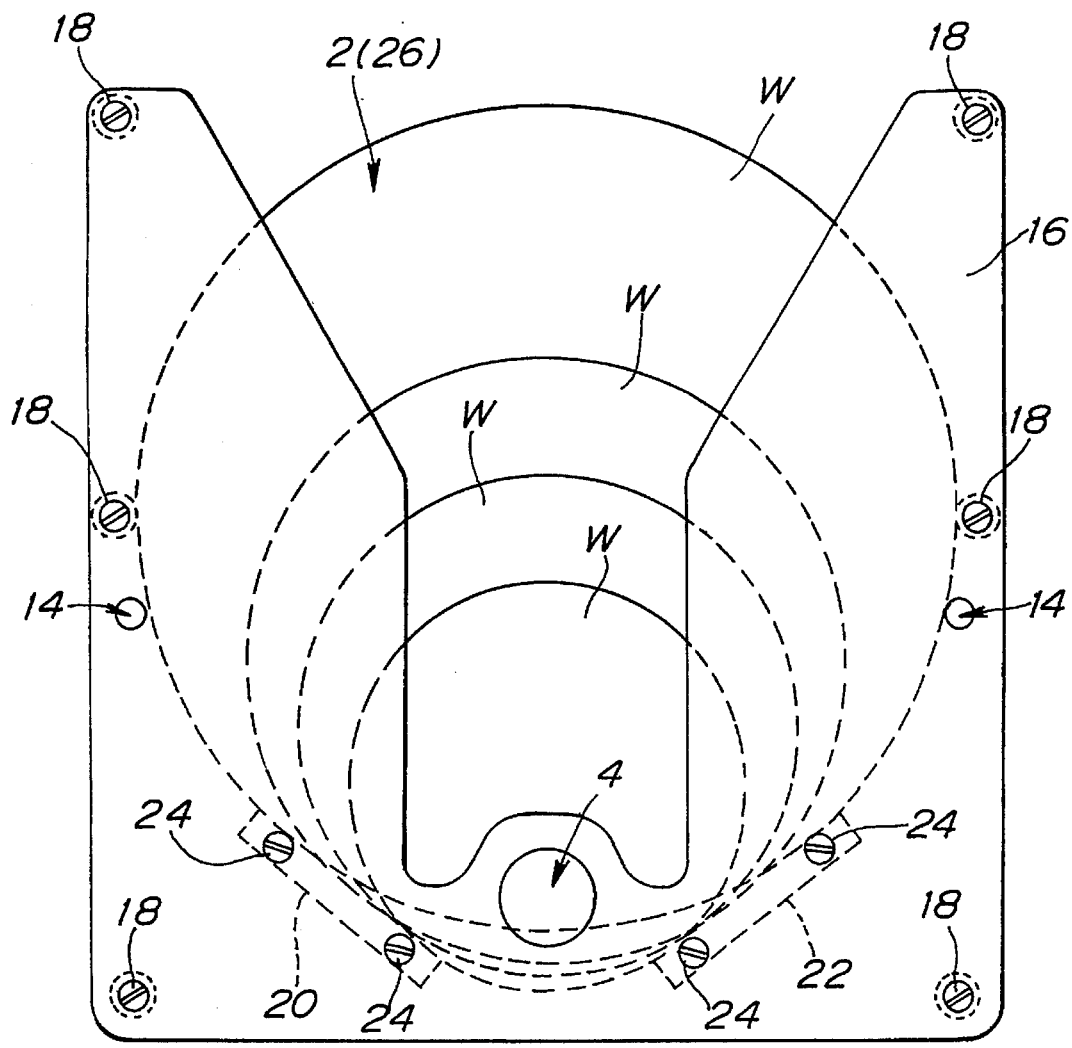
FIG. 1 is a plan view of a working example of this invention.
Figure 2:
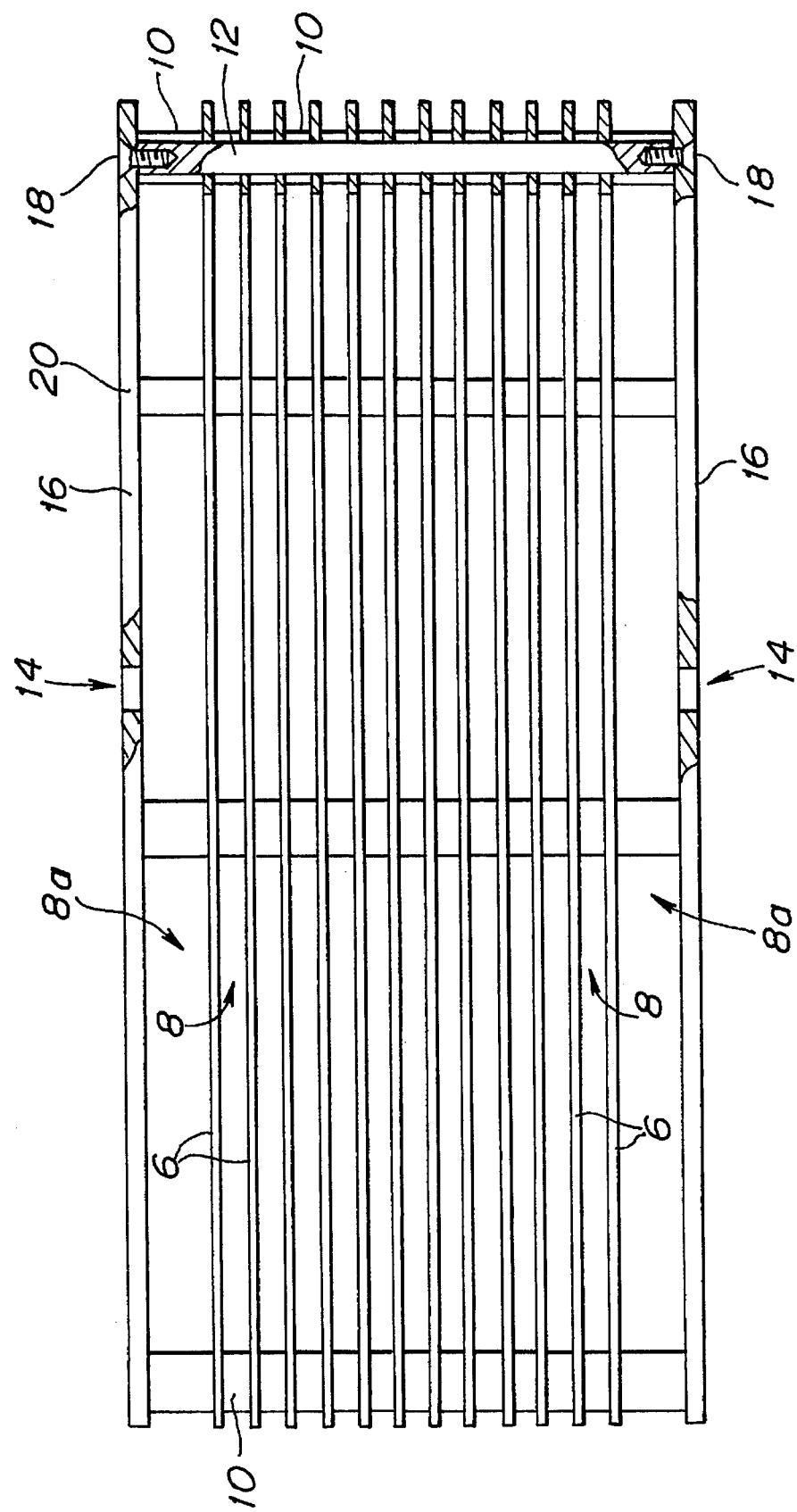
FIG. 2 is a partially sectioned left lateral view of the working example illustrated in FIG. 1
Figure 3:
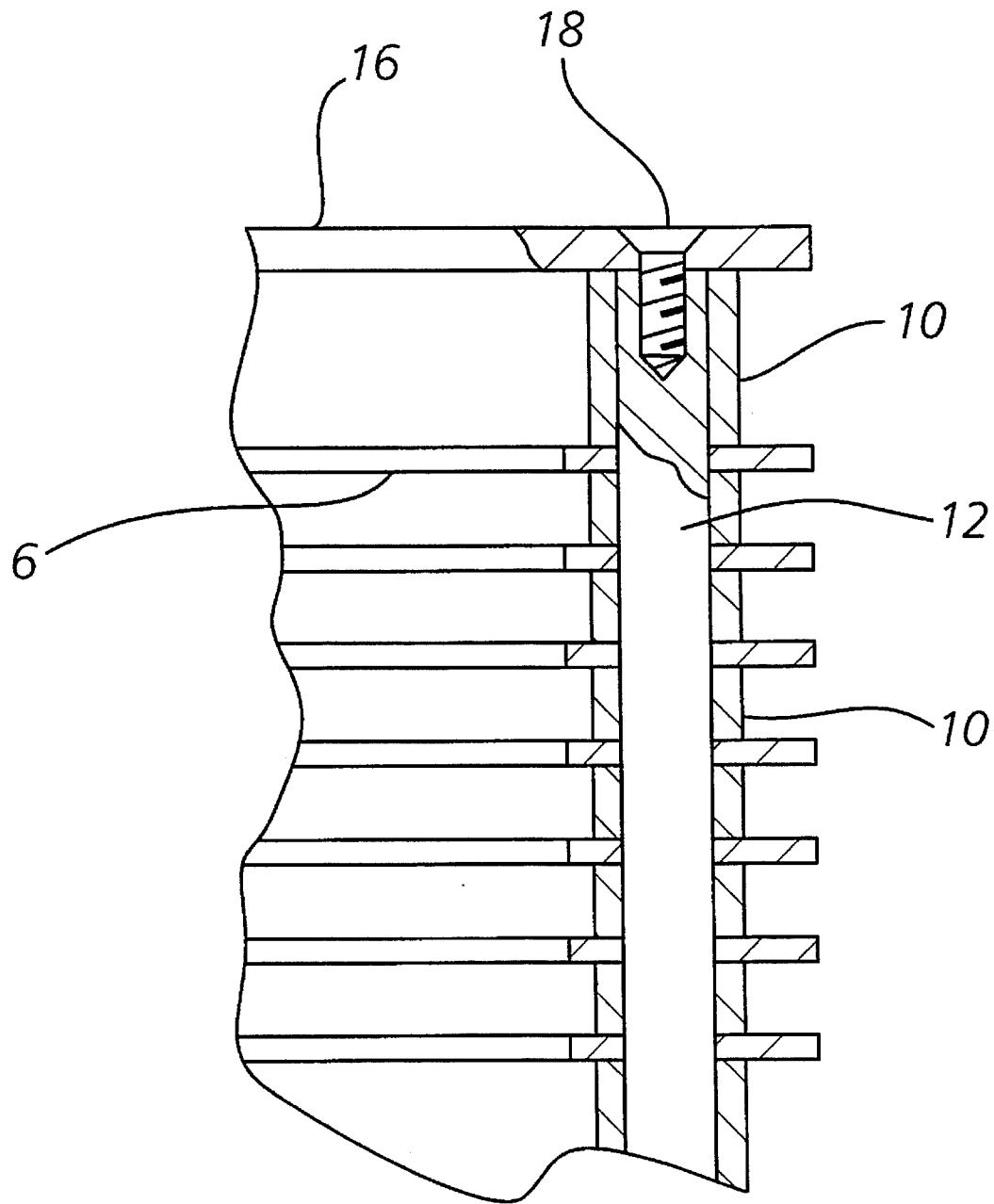
FIG. 3 is an expanded view of FIG. 2 where the spacers 10 are shown in cross section.

Now, this invention will be described more specifically below with reference to the embodiment illustrated in the drawings. Example:

As illustrated in FIGS. 1 and 2, a multiplicity of rectangular shelves 6 which have a notch 2 of the general shape of the letter V (or U) formed in one side of the rectangle and a through inspection hole 4 for discerning the presence or absence of a wafer disposed near the farthest recess of the notch are parallelly placed at intervals to give rise to empty spaces 8 for allowing insertion of wafers extractably between adjacent shelves and supported and fixed in place with a plurality of struts 12 through the medium of spacers 10.

Supporting plates 16 are disposed one each at the opposite end parts of the struts 12. To be specific, the supporting plates 16 which are larger in wall thickness than and identical in shape with the shelves 6 and are provided with an engaging hole (pin hole) 14 adapted to keep the wafer cassette at a fixed place are attached to the struts 12 with machine screws 18 as disposed parallelly to the shelves 6 and away at a suitable distance from the shelves 6. Supporting plates 16 also have a through inspection hole 4 in the position equivalent to the position of the through inspection hole 4 of the shelves.

Empty spaces 8a which are formed between the supporting plates 16 and the respectively adjacent shelves 6 have a larger size than those between the adjacent shelves 6, 6.

When the wafer cassette is lifted by a robot and moved or loaded, the robot produces a prescribed motion by having claws thereof inserted into the open spaces 8a. Further, since the supporting plates 16 have a larger thickness than the shelves 6, they possess ample strength for defying the breakage which otherwise would possibly be inflicted thereon when the claws of the robot are hooked on the supporting plates 16 and operated to lift, move, or load them.

Further, buffer members 20, 22 are perpendicularly attached to the shelves 6 with machine screws 24 and disposed as opposed to each other across the through inspection holes 4 so as to include an obtuse angle therebetween.

The notches in the multiplicity of shelves 6 jointly form a recess 26 of the general shape of the letter V which allows insertion in the extractable manner of the leading end part of a wafer conveyor (not shown).

The shelves 6, spacers 10, supporting plates 16, and buffer members 20, 22 mentioned above are made of a hard polyvinyl chloride resin and the struts 12 are made of such a metal as stainless steel.

In the present working example, the through inspection holes 4 are positioned at the central part in the direction of width of the shelves 6 and the supporting plates 16 and the buffer members 20, 22 are symmetrically disposed on the opposite sides of the through inspection holes 4. The shelves 6 and the supporting plates 16 are so shaped as to measure about 238 mm in length and about 230 mm in width. The angle included between the buffer members 20, 22 is set at 135 degrees. The buffer members 20, 22 are disposed in the recesses of the open spaces for insertion of wafers.

This wafer cassette, therefore, allows ingression and egression of wafers W of diameters varying in the range of 4 to 8 inches as illustrated in FIG. 1. Thus, the wafers of such varying sizes are orderly stowed in the wafer cassette in such a state that the centers thereof fall substantially on one straight line and even the wafers of larger diameters do not protrude from the cassette. This wafer cassette constitutes a free-size wafer cassette.

Now, the method for using the wafer cassette will be described below. The leading end part (not shown) of the wafer conveyor is inserted in a recess 26 mentioned above by lifting the wafer cassette with the claws of the robot inserted in the open space 8a and then setting the wafer cassette at a prescribed position (at which time, the shelves 6 are so disposed as to lie substantially on a horizontal plane) with the engaging hole 14 meshed with a protruding part (not shown) disposed at a stated position. When the wafer conveyor in the above state is set operating, the wafers carried on the conveyor are discharged past the leading end part of the conveyor and automatically inserted one after another into the empty spaces 8 for insertion of wafers and stowed in the cassette after colliding against the buffer members.

The cassette which has accommodated wafers to capacity is similarly transferred by a conveying robot as one integral unit to a prescribed position in the next step of process and fixed in plate through the medium of the engaging hole 14.

It is clearly noted from the description given thus far, the wafer cassette embodying the first aspect of this invention allows wafers carried on the wafer conveyor to be automatically stowed therein by inserting the leading end part of the wafer conveyor into the empty space mentioned above and then setting the conveyor operating. Thus, the accommodation of individual wafers in the cassette and the conveyance of a cassette as an integral unit by means of a robot are realized. The first aspect of this invention, accordingly, brings about an effect of automating the wafer processing system to the very end.

The wafer cassette embodying the second aspect of this invention has an effect of enabling the work of inserting the leading end part of the wafer conveyor into the cassette and the work of conveying the cassette filled with wafers to capacity to the prescribed position in the next step of process to be carried out automatically by means of a conveying robot.

The wafer cassette embodying the third aspect of this invention manifests an effect of enabling even wafers of varying sizes to be stowed orderly therein so that the centers of these wafers fall substantially on one straight line. The through inspection holes permit an optical sensor to emit light and discern the presence or absence of wafers in the cassette.

While there have been shown and described preferred embodiments of this invention, it is to be distinctly understood that the invention is not limited thereto but may be otherwise variously embodies and practiced within the scope of the following claims.

What is claimed is:

1. A wafer cassette comprising;

a multiplicity of shelves provided in one side thereof with a notch, wherein the notches in said multiplicity of shelves jointly form an empty space for extractably admitting a leading end part of a wafer conveyor:

said shelves placed at intervals to give rise to open spaces therebetween for insertion of a wafer;

a plurality of spacers;

buffer members provided in said open spaces, each adapted to meet in collision with part of the outer periphery of a wafer; and a plurality of struts for supporting and fixing in place said multiplicity of shelves through the medium of said spacers.

2. A wafer cassette comprising;

a multiplicity of shelves provided in one side thereof with a notch, wherein the notches in said multiplicity of shelves jointly form an empty space for extractably admitting a leading end part of a wafer conveyor;

said shelves placed at intervals to give rise to open spaces therebetween for insertion of a wafer;

buffer members provided in said open spaces each adapted to meet in collision with part of the outer periphery of a wafer;

wherein said buffer members comprise two platelike buffer members which,
   are disposed near the farthest recesses of said notches in said multiplicity of shelves, and
   are disposed perpendicularly to said shelves as symmetrically opposed to each other so as to include therebetween an angle in the range of 130 to 140 degrees.

3. A wafer cassette according to claim 1, further comprising; supporting plates which are;

shaped identically with said shelves, provided with engaging holes for fixing said cassette a prescribed position, attached one each to the opposite terminal parts of said plurality of struts, and disposed parallel to said shelves.

4. A wafer cassette according to claim 2, further comprising supporting plates, wherein said shelves and supporting plates are;
- provided at the center of symmetry in the space intervening between the buffer plates, and
- provided with through inspection holes for allowing discernment of the presence or absence of a wafer in the open space between said shelves.

5. A wafer cassette according to claim 1 wherein said buffer members comprise two platelike buffer members which;
- are disposed near the farthest recesses of said notches in said multiplicity of shelves, and
- are disposed perpendicularly to said shelves as symmetrically opposed to each other so as to include therebetween an angle in the range of 130 to 140 degrees.

6. A wafer cassette according to claim 1 further comprising;
wherein said buffer members comprise two platelike buffer members which,
- are disposed near the farthest recesses of said notches in said multiplicity of shelves, and
- are disposed perpendicularly to said shelves as symmetrically opposed to each other so as to include therebetween an angle in the range of 130 to 140 degrees.

7. A wafer cassette according to claim 2 further comprising:
- a plurality of spacers; and
- a plurality of struts for supporting and fixing in place said multiplicity of shelves through the medium of said spacers.

* * * * *